(12) United States Patent
Thollon et al.

(10) Patent No.: US 7,648,942 B2
(45) Date of Patent: Jan. 19, 2010

(54) PROCESS FOR PREPARING METAL OR METAL ALLOY NANOPARTICLES DISPERSED ON A SUBSTRATE BY CHEMICAL VAPOUR DEPOSITION

(75) Inventors: Stéphanie Thollon, St. Niziers du Moucherotte (FR); Fabien Luc, Domene (FR); Joël Barrault, Liguge (FR); Sabine Valange, Poitiers (FR); Erwan Guelou, Buxerolles (FR); Marco Daturi, Epron (FR); Fabien Can, Caen (FR)

(73) Assignees: Commissariat a l'Energie Atomique, Paris (FR); Centre National de la Recherche Scientifique, Paris (FR); Universite de Poitiers, Poitiers Cedex (FR)

( * ) Notice: Subject to any disclaimer, the term of this patent is extended or adjusted under 35 U.S.C. 154(b) by 116 days.

(21) Appl. No.: 11/793,888

(22) PCT Filed: Dec. 23, 2005

(86) PCT No.: PCT/FR2005/003264

§ 371 (c)(1),
(2), (4) Date: Jun. 21, 2007

(87) PCT Pub. No.: WO2006/070130

PCT Pub. Date: Jul. 6, 2006

(65) Prior Publication Data

US 2008/0128656 A1    Jun. 5, 2008

(30) Foreign Application Priority Data

Dec. 23, 2004    (FR) ................... 04 53179

(51) Int. Cl.
*B01J 23/50* (2006.01)
*B01J 23/66* (2006.01)
*B05D 5/12* (2006.01)
*B05D 1/12* (2006.01)

(52) U.S. Cl. .............. 502/347; 502/330; 427/125; 427/180; 427/585

(58) Field of Classification Search .............. 502/330, 502/347; 427/125, 180, 585
See application file for complete search history.

(56) References Cited

U.S. PATENT DOCUMENTS

2003/0039860 A1    2/2003    Cheon et al.
2007/0148345 A1    6/2007    Decams et al.

FOREIGN PATENT DOCUMENTS

FR          2 852 971         3/2003
WO    WO 2004/087988    * 10/2004

OTHER PUBLICATIONS

Richter, M. et al., Low-temperature conversion of $NO_x$ to $N_2$ by zeolite-fixed ammonium ions, Applied Catalysis B: Environmental 15 (1998), 129, Cited in application description.

(Continued)

*Primary Examiner*—Timothy C Vanoy
*Assistant Examiner*—Daniel Berns
(74) *Attorney, Agent, or Firm*—Brinks Hofer Gilson & Lione

(57) ABSTRACT

Process of depositing nanoparticles of a metal or of an alloy of said metal, said metal being chosen from the metals from columns VIIIB and IB of the Periodic Table, dispersed on a substrate by chemical vapour deposition (CVD), from one or more precursors, in which the deposition is carried out in the presence of a gas comprising more than 50 vol % of a reactive oxidizing gas.

Substrate comprising at least one surface, dispersed on which are nanoparticles made of a metal or of an alloy of metals, for example made of silver or a silver alloy.

Use of the substrate to catalyse a chemical reaction, for example an $NO_x$ elimination reaction.

51 Claims, 10 Drawing Sheets

H 1μm

OTHER PUBLICATIONS

Olsson, L. et al. The influence of pt oxide formation and Pt dispersion on the reactions $NO_2 <=> NO + \frac{1}{2} O_2$ over $Pt/Al_2O_3$ and $Pt/BaO/Al_2O_3$, Journal of Catalysis, 210 (2002) 340, Cited in application description.

Samoilenkov et al., Low-temperature MOCVD of conducting, micrometer-thick, silver films, Chemical Vapor Deposition, 8 (2)) (2002), 74, Cited in application description.

Chen, T.-Y. et al. 2-Methyl-1-hexen-3-yne lewis base stabilized beta-diketonate copper (l) complexes: x-ray structures, theoretical study, and low-temperature chemical vapor deposition of copper metal. Chemical Mater 13, 3993-4004 (2001), Cited in application description.

Serp, Philippe, et al., "One-Step preparation of highly dispersed supported rhodium catalysts by low-temperature organometallic chemical vapor deposition", Journal of Catalysis, 1995, p. 294-300, vol. 157, Search Report.

Serp, Philippe, et al., "Single-step preparation of activated carbon supported platinum catalysts by fluidized bed organometallic chemical vapor", Carbon, 1999, p. 527-530, vol. 37, Search Report.

Mäkelä, J.M. et al., "Generation of metal and metal oxide nanoparticles by liquid flame spray process", Journal of Materials Science, 2004, p. 2783-2788, vol. 39, Search Report.

Thollon, Stephanie, et al., "Pulsed liquid injection metalorganic chemical vapor deposition of metallic nanostructured catalysts. Evaluation of their deVOC catalytic properties", Meet. Abstr.: Meeting Abstracts; 207th Meeting of the Electrochemical Society- Meeting Abstracts 2005, May 15-20, 2005, p. 87, Search Report.

Miyoshi, Naoto, et al., Development of new concept three-way catalyst for automotive lean-burn engines, SAE Technical Papers Series No. 950809, 1995.

* cited by examiner

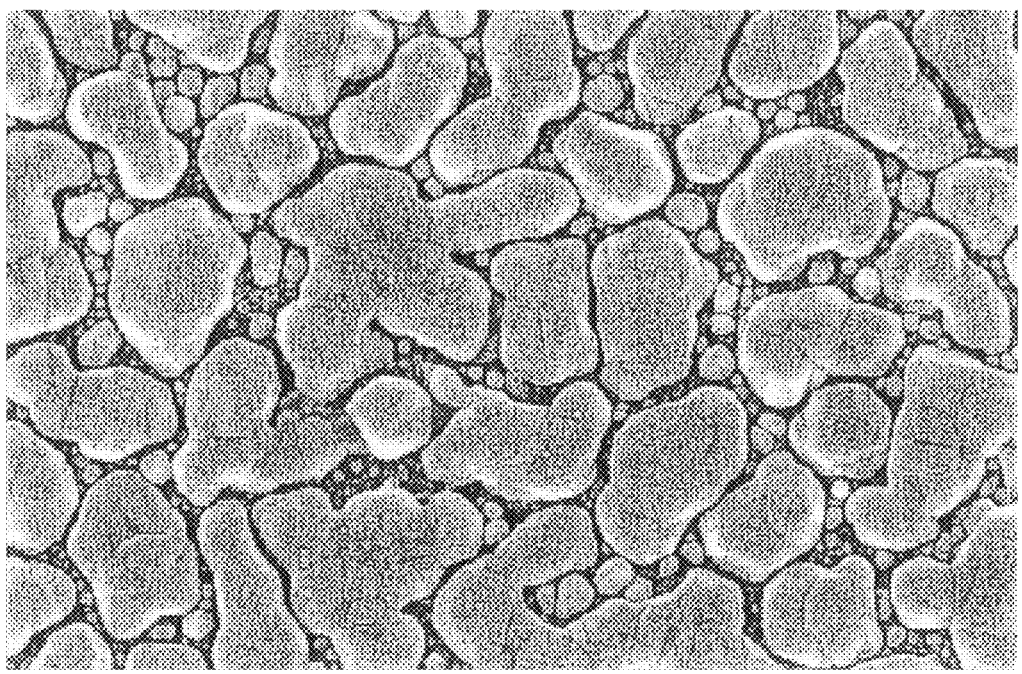
FIG. 1  ⊢─┤ 100nm
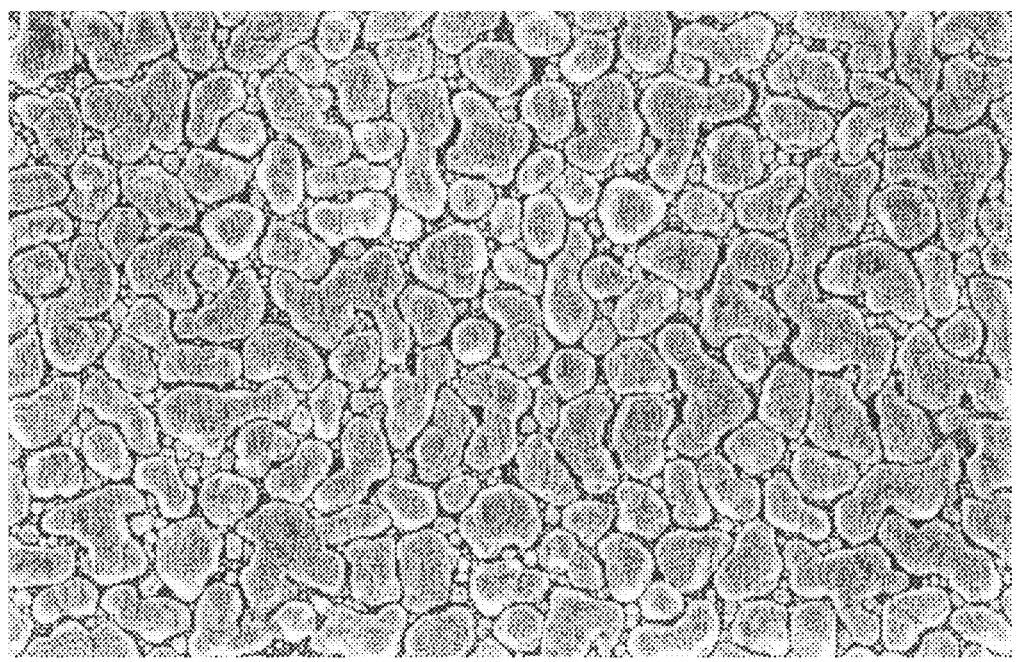
FIG. 2  ├─────┤ 1μm

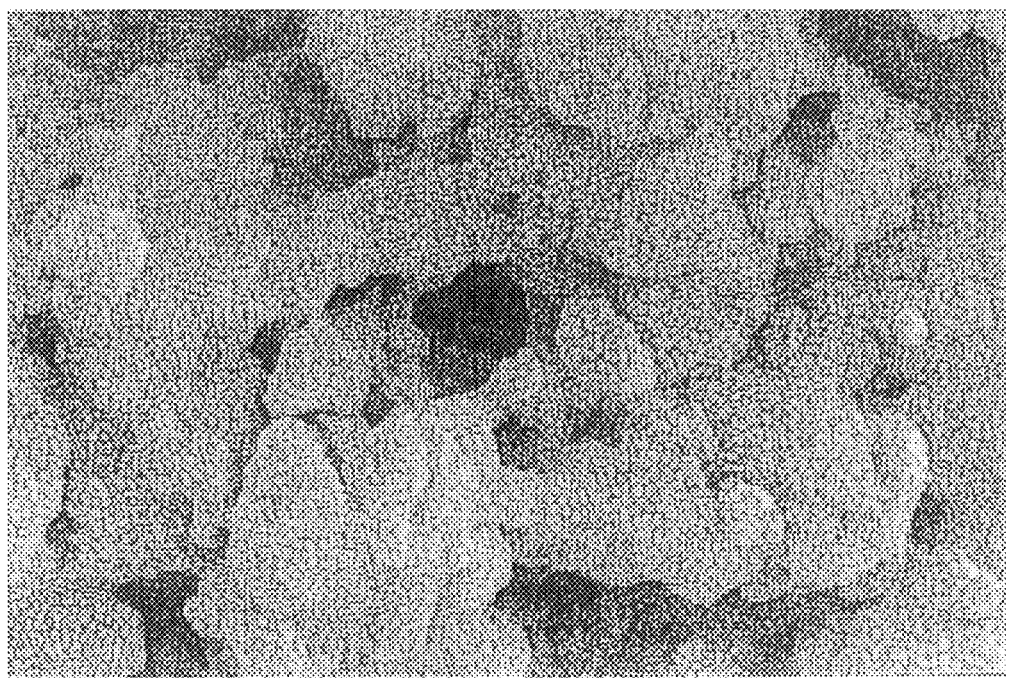
FIG. 3  ⊢⊣ 300nm
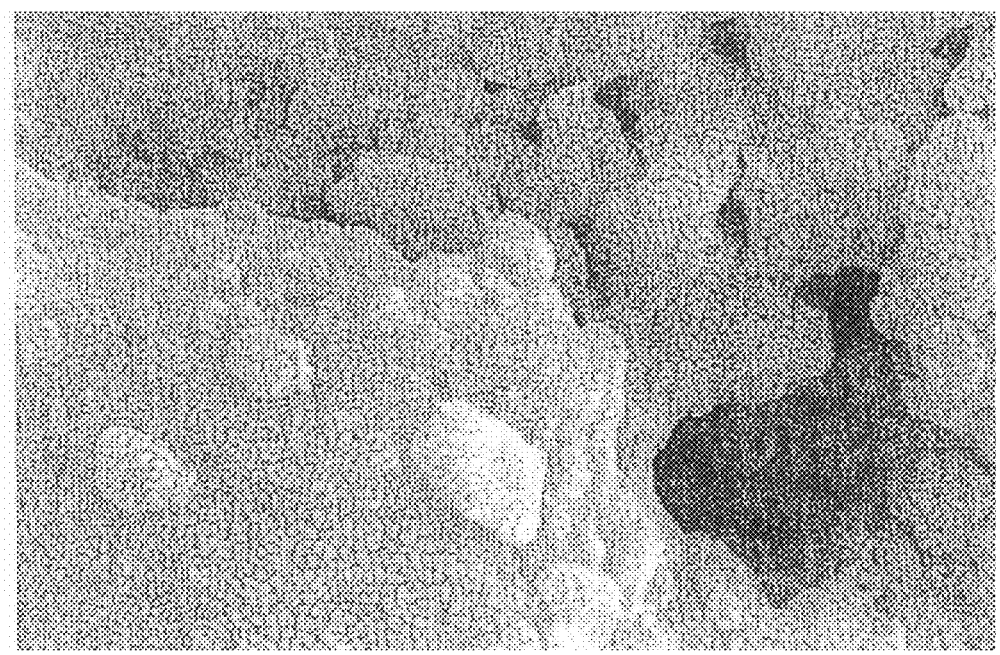
FIG. 4  ⊢―――⊣ 1μm

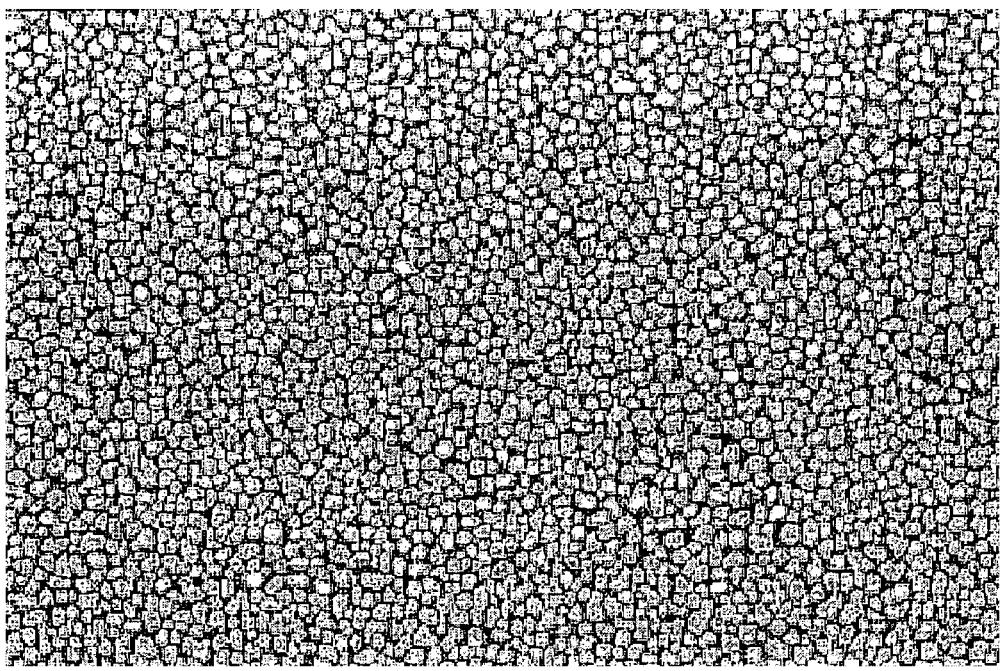
FIG. 5  ⊢⊣ 200nm
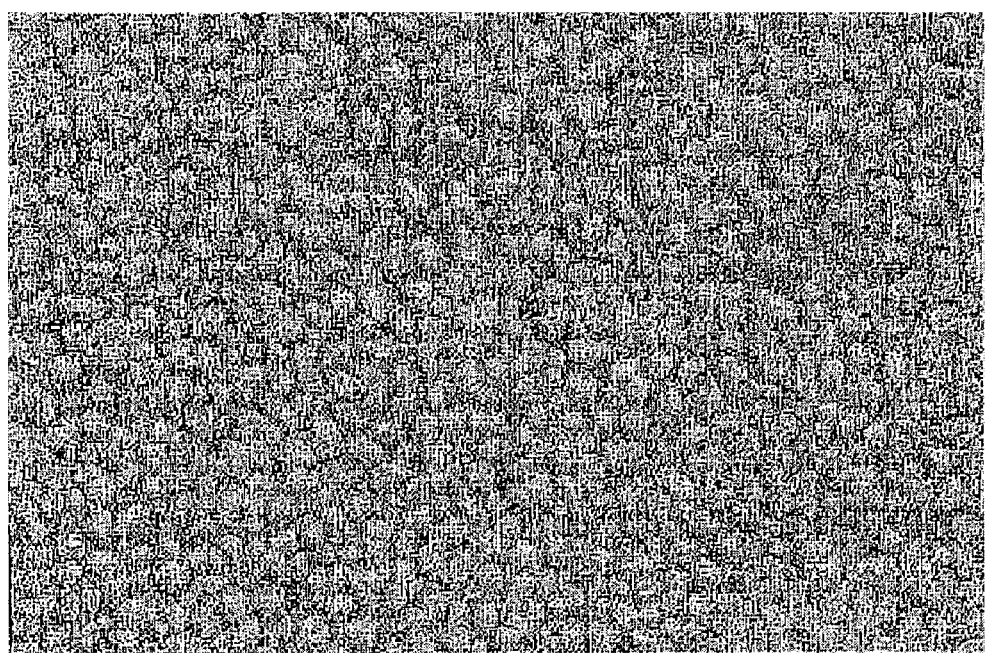
FIG. 6  ⊢⊣ 200nm

H 1μm

H 200nm

H 100nm

PROCESS FOR PREPARING METAL OR METAL ALLOY NANOPARTICLES DISPERSED ON A SUBSTRATE BY CHEMICAL VAPOUR DEPOSITION

TECHNICAL FIELD

The invention relates to a process for preparing nanoparticles of a metal or of an alloy of metals, on a substrate by chemical vapour deposition (CVD). The metal or metals are chosen from the metals from columns VIIIB and IB of the Periodic Table.

More particularly, the invention relates to a process for preparing silver or silver alloy nanoparticles dispersed on a substrate by CVD.

The invention also relates to a substrate comprising at least one surface on which said nanoparticles are dispersed.

The invention also relates to the uses of said substrate, in particular for catalysing a chemical reaction.

The technical field of the invention may be defined generally as that of preparing nanomaterials comprising metal nanoparticles, dispersed on a substrate or support, the latter being dense or porous.

These nanomaterials find application in the fields of electronics, optics, and especially in catalysis, especially for protecting the environment.

A particularly advantageous field of application of the invention is that of removing pollutants such as nitrogen oxides NO and $NO_x$ found in the air, these pollutants coming, in particular, from the exhaust gases of automotive vehicles.

Indeed, the new European Directives, aiming to drastically reduce the release of pollutant gases (VOCs, hydrocarbons, CO, $NO_x$, etc.) into the air, naturally lead to ecological and economic solutions being sought in order to meet the release standards. Due to the current and future constraints imposed, amongst others, on the emission limits for particular petrol and diesel vehicles, and also for the chimneys of incinerators, cement works or glass works, the reduction of $NO_x$ emissions has become one of the favoured research subjects in the field of environmental protection. Numerous research teams, both academic and industrial, have brought attention to the various parameters directly influencing the "$deNO_x$" reaction, namely the type of supports, reactive gases (CO, $H_2$, $NH_3$, hydrocarbons, etc.) and especially catalyst systems used in the processes which may possibly result in the decrease, or even removal, of the $NO_x$.

The present invention therefore relates especially to the treatment of nitrogen oxides mainly derived from automotive vehicles, or from stationary sources, and particularly lies within the framework of the implementation of catalysts favouring the selective catalytic reduction of NO in the presence of hydrocarbons (commonly known as the H—SCR or "lean $deNO_x$" process), or else trapping the $NO_x$ in the form of nitrates and successive reduction, or removing the $NO_x$ via the ammonia process.

To summarize, the recent appearance of direct petrol injection engines known as "lean burn" engines, which operate, like diesel engines, with a large excess of oxygen, has been accompanied by the development of novel types of catalytic converters.

Although the catalytic oxidation of the reducing pollutants does not pose any difficulties within the strongly oxidizing gas stream exiting a diesel engine, the reduction of $NO_x$ (to $N_2$) in such a medium is a problem that to date has not been solved. Several catalytic systems are being studied and require further development.

Those that operate according to the H—SCR process are generally composed of a metallic phase (especially composed of one or more noble metals) supported on a metal oxide that is generally an aluminium oxide mixed with a cerium oxide and to which other transition metal oxides and/or oxides of metals from column IIIA may or may not be added. The oxidation of a reducing agent, introduced as a continuous or pulsed flow, maintains the metallic character of the supported phase, capable of dissociating the nitrogen oxides. The support, amongst other things, helps to remove the oxygen derived from the dissociation.

The particularity of catalysts known as "$NO_x$ trap" catalysts is to operate by successive alternations under lean and rich regimes, the first phase corresponding to the oxidation and storage, in the form of nitrates, of the $NO_x$ present in the gas effluents exiting the engine, the second to their reduction. This route is, to date, presented as being the most attractive in the field of automotive pollution control as it requires a reactive mixture close to that present at the outlet of the combustion chamber of diesel engines and furthermore appears much more economical in the use of reducing agent.

The choice of metals during the development of "$deNO_x$" and "$NO_x$ trap" catalysts is made from various elements of group VIII of the Periodic Table, and more specifically between palladium, platinum and rhodium. Conventionally, a combination is found of Pt and Rh, the Pt being assumed to be involved in the oxidation reactions (of the nitrogen monoxide during the lean phase and in the ammonia SCR process, of the reducing agents during the rich or reductive phase), whereas the rhodium would mainly be involved in the reduction reactions of NO and of $NO_2$ to give $N_2$. These metals also play a part during the rich phase in the decomposition processes of the species (nitrates) stored on the $NO_x$ trap catalysts.

The metals may be deposited with or on an oxide that plays the part of the adsorbent in the $NO_x$ trap catalysts or of an oxygen exchanger in the other cases: to summarize, its role, in the first case, is both to store the $NO_x$ during the lean phase, and to allow their reduction during the rich periods [1]. To do this, the most suitable materials are alkali metals and alkaline-earth metals (Ca, Sr, Ba, K or Na), due either to their low electronegativity, or to their high basicity. Indeed, the higher the basicity of the element in question, the greater its affinity towards the $NO_x$. For this reason, the most commonly used elements are barium and strontium. In the second case, the oxide constitutes an oxygen container for the oxidation. It must therefore have excellent $O_2$ exchange properties, as is the case for systems based on rare-earth elements, such as Ce, Pr, etc., or on transition elements such as Mn, Fe, Co, Ni, etc.

The selective catalytic reduction of nitrogen oxides via ammonia or urea is, on the other hand, currently used for depolluting effluents derived from stationary sources, via the reactions:

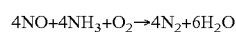

or

The catalytic materials used are titanium oxides bearing vanadium, molybdenum and tungsten, or zeolites. Their drawbacks are due to the instability of the active phase and of the support in extreme usage conditions, or following ageing, and to the ammonia leaks. To avoid this, it has recently been envisaged to store the ammonia in a zeolite matrix and to then make it react with the stream containing the $NO_x$ [2]. In order for this process to be effective, a large amount of $NO_2$ in the reaction stream is essential, hence the need to partially oxidize NO to $NO_2$ at the reaction temperature.

Besides the nature of the metal or of the metal alloy, the optimization of the content and of the dispersion is essential during the development of the catalysts, as it conditions the efficiency of these materials in the SCR reactions.

Precise studies have been carried out on the relationship between the $NO_x$ conversion activity and the size of the metallic particles produced by impregnating/drying/calcining. For example, Olsson et al. [3] themselves observed that the larger (around 100 nm in diameter) and more dispersed the platinum particles, the more the oxidation of NO to $NO_2$ was favoured. Other recent studies cite catalytic results in the "$deNO_x$" reaction with silver-based catalysts showing that the influence of the chemical form and content of Ag is important: the best "$deNO_x$" performances were obtained for low loading levels (1 to 3 wt %), when the Ag catalyst is mainly present in a +1 oxidation state. In these two examples, the catalysts promote the oxidation of NO to ad-$NO_x$ species that react subsequently to form intermediary reactive species such as $NO_2$, nitrates, etc., capable of being converted to $N_2$.

Furthermore, it is known that the properties of a metal change when the particles have a size in the nanometre range. Noble metals such as Au, Pt and Ir become very reactive when they reach a nanoscale size.

In particular, due to the lower cost of precursors based on silver and due to the high catalytic potential of materials based on this metal, silver-based catalysts have been the subject of particular attention and it has been shown that their catalytic efficiency was very slightly increased as a result of an increase in their dispersion and therefore of a decrease in the size of the particles.

By way of example, silver nanoparticles having a size of 7 to 15 nm prepared by reduction of $AgNO_3$ or of $AgClO_4$ in aqueous solution with a gentle reducing agent such as $NaBH_4$, $N_2H_4$, or ascorbic acid have very good performances in the process of reducing nitroaromatic compounds to amines in aqueous medium.

Usually, impregnation is the main process of preparing supported metal catalysts that may or may not be based on silver, such as those that are used to convert nitrogen oxides $NO_x$, but this process requires several steps comprising high-temperature reductions and oxidations. This process provides aggregate sizes of around 1 to 10 μm.

Besides impregnation, the catalysts currently used and developed are deposited by other conventional preparation processes, such as the sol-gel process, coprecipitation and others, etc. The catalysts prepared by all these conventional processes (impregnation, sol-gel process, coprecipitation) have, for example, $NO_x$ conversion activities in a temperature range generally between 300° C. and 500° C. Nevertheless, real difficulties are encountered as regards the control of the size of the nanoparticles, especially as regards the particles having a size (diameter) of less than 50 nm; and also their dispersion, which thus negatively influences the catalysis yields and the activation temperatures.

Another process enabling a metal to be deposited on a substrate is the process known as Organometallic Chemical Vapour Deposition (OMCVD). This process has many advantages relative to the processes such as impregnation or electrodeposition or even relative to Physical Vapour Deposition (PVD) technologies. Indeed, the OMCVD process makes it possible to cover parts having complex geometries such as catalytic supports, for example foams, honeycombs, ceramics, or zeolites without it being necessary to work in the high vacuum field, namely of 100 to 500 Pa, which makes this a process that can easily be scaled up to an industrial level as compared with the Physical Vapour Deposition (PVD) process for example.

Moreover, the OMCVD deposition process is a process that can be qualified as "clean", which generates few liquid or gas effluents unlike, in particular, electrodeposition which is a very polluting process.

The OMCVD process makes it possible, in particular, to prepare high-performance catalytic nanomaterials. Thus, the document by P. Serp, R. Fuerer, R. Morancho, P. Kalck, Journal of Catalysis, 157 (1995), 294-300 describes the one-step preparation of catalysts comprising highly dispersed palladium nanoparticles by low-temperature OMCVD onto silica substrates in the presence of a helium and hydrogen atmosphere. These catalysts have a better catalytic activity for hydrogenation than the catalysts deposited by a conventional impregnation technique.

In the particular case of silver, the CVD processes in general and especially the OMCVD processes have only, until now, allowed the deposition of continuous layers, that is to say covering the whole of the substrate onto which they are deposited.

In other words, regarding the processes for vapour phase deposition of silver films, the few scientific works available on this subject relate only to the synthesis of continuous thin films of conductive silver on flat substrates that are mainly used in the fields of electronics, optics and magnetism.

Thus, the document by Samoilenkov et al., Chemical Vapour Deposition, 8(2) (2002), 74, describes a process for depositing thick films of silver by OMCVD. The depositions obtained are in the form of continuous films or in the form of islands having a diameter greater than 1 μm, due to the high synthesis temperatures that are greater than 500° C.

Similarly, document FR-A-2 852 971 describes a process for depositing a silver film by CVD on a substrate, especially a semiconductor substrate. The deposition is carried out using a solution of a silver precursor which is a silver carboxylate—silver pivalate being preferred—dissolved in a solvent such as mesitylene, cyclohexane, xylene, toluene and n-octane. An amine or a nitrile is added into the solution in order to promote dissolution of the precursor.

The deposition chamber is under a hydrogen or oxygen atmosphere, that is to say that the hydrogen or oxygen is introduced into the deposition chamber in the form of a mixture with $N_2$, in which the $H_2/N_2$ or $O_2/N_2$ volume ratio is less than or equal to 1. This means that the reactive gas ($O_2$ or $H_2$) is in the minority in the gas mixture.

This process makes it possible to obtain thin (having a thickness less than or equal to 50 nm), or thick (having a thickness of 50 nm to 1 μm) continuous layers.

In the examples, $O_2/N_2$ flow ratios of 0.075 (Examples 1 and 2) and 0.8875 (Example 4) are used and in each case continuous silver films are obtained. This process therefore makes it impossible to prepare silver nanoparticles dispersed on a substrate.

Therefore, in view of what has been mentioned so far there is, generally, a need for a process for preparing, for depositing, metal or metal alloy nanoparticles onto a substrate which makes it possible to adjust and control the size and morphology of the metal or alloy nanoparticles and also their dispersion and concentration on said substrate.

Also, there is a need for a process for preparing, for depositing, metal or metal alloy nanoparticles on a substrate which, used as a catalyst, for example, for nitrogen oxide $NO_x$ elimination reactions, has an increased catalytic effectiveness, especially in terms of yield, selectivity and activation temperature, as well as an increased lifetime.

This process must, furthermore, be simple, reliable and of low cost, both financially and in terms of energy.

In particular, there is a need that has not yet been met for a process that makes it possible to deposit dispersed silver nanoparticles on a substrate by chemical vapour deposition.

The goal of the invention is, amongst other things, to meet these needs.

This goal, and also others, are achieved, according to the invention, by a process for depositing nanoparticles of (made of) a metal or of (made of) an alloy of said metal, said metal being chosen from the metals from columns VIIIB and IB of the Periodic Table, dispersed on a substrate by chemical vapour deposition (CVD), from one or more precursors, in which the deposition is carried out in the presence of a gas comprising more than 50 vol % of a reactive oxidizing gas.

Advantageously, the metal is chosen from silver, rhodium, platinum, palladium and iridium.

In the case of nanoparticles made from an alloy, said alloy is preferably chosen from the alloys of metals from columns VIIIB and IB of the Periodic Table such as Ag, Rh, Pt, Pd and Ir with one another.

Advantageously, the nanoparticles are enclosed in a metal oxide matrix, said oxide being chosen, for example, from the oxides of alkali metals, alkaline-earth metals, transition metals or rare-earth metals, such as Ca, Sr, Ba, K, Na, Ce, Pr, Mn, Fe, Co, Ni, etc.; or a carbon matrix; or are combined with a zeolite.

Advantageously, the gas in whose presence the deposition is carried out comprises more than 70 vol %, preferably 100 vol % of the reactive oxidizing gas.

The reactive oxidizing gas may be chosen from oxygen, carbon dioxide, ozone, $N_2O$, and mixtures thereof.

The gas in whose presence the deposition is carried out may be composed of a mixture of the oxidizing gas and an inert gas.

The inert gas may be chosen from argon, nitrogen, helium, and mixtures thereof.

In said mixture of oxidizing gas and an inert gas, the oxidizing gas/inert gas flow rates ratio is (strictly) greater than 1, which corresponds to the abovementioned condition according to which, in the process of the invention, the oxidizing gas is present at more than 50 vol % in the gas mixture in whose presence the deposition is carried out.

The process according to the invention is fundamentally distinguished from the processes of the prior art for depositing a metal, in particular silver, by OMCVD on a substrate as, fundamentally, according to the invention, the deposition of a metal or metal alloy, in particular silver or a silver alloy, is carried out in the presence of a gas—called the reaction gas—which comprises predominantly a reactive oxidizing gas such as oxygen, $CO_2$ or a mixture of these gases.

In other words, said reaction gas is composed of more than 50 vol % of a reactive oxidizing gas.

When the gas in whose presence the deposition is carried out is composed of a mixture of oxidizing gas and an inert gas, this condition is expressed by the fact that the oxidizing gas/inert gas flow rates ratio is greater than 1 whereas in document FR-A-2 852 971, this ratio is less than or equal to 1.

Generally, the process according to the invention makes it possible to deposit metals or alloys that act, for example, as catalysts within complex surface (2D) or volume (3D) structures, without the use of a liquid phase. The metal or alloy catalysts are in the form of particles of nanoscale size (for example, 1 to 100 nm in diameter) that are well dispersed, in particular, at the surface of the (dense or porous) support.

According to the invention, the control of the processing parameters (such as the nature of the gases, the injection parameters, the pressure) makes it possible to develop discontinuous films at relatively low deposition temperatures (for example, often below 400° C.). The porous film thus obtained may be in the form of metallic islands of nanoscale size, for example often around 1 to 100 nm in diameter) that are well dispersed at the surface of the (dense or porous) support, which gives them a large active surface area. The synthesis technique according to the invention makes it possible to develop layers whose composition, and in particular porosity, may be adjusted by certain parameters of the process, such as the nature and the flow rate of the reactive gas, amount of precursor, temperature, pressure, etc., directly influencing the size and the dispersion of the nanoparticles which are essential factors for catalytic applications.

In the case especially where the metals or alloys act as catalysts, the control of the deposition conditions, thanks to the process of the invention, makes it possible to adjust the morphology (size) and the concentration (dispersion) of the catalyst aggregates. The activity of the catalytic deposition obtained is closely linked to these two parameters, and which is expressed, depending on the system studied, by a lowering of the reaction temperatures or else by a modification of the reaction kinetics. Finally, the ability, on the one hand, to localize the catalyst in the volume of the parts and, on the other hand, to disperse it on a nanoscale allows a significant drop in the loading level of the active phase and therefore in the cost of the devices, especially for those using noble metals.

The process according to the invention especially makes it possible, surprisingly, to prepare, via the OMCVD technique, metal or metal alloy nanoparticles and more particularly silver or silver alloy nanoparticles dispersed at the surface of the substrate, whereas in the prior art represented, for example, by document FR-A-2 852 971, it is only possible to prepare continuous films or layers that cover the whole of the surface of the substrate.

For the first time, thanks to the process according to the invention, it has been possible to prepare, via the "OMCVD" technique, nanoparticles based on a metal or a metal alloy, and in particular based on silver or a silver alloy, on a substrate, regardless of the type of substrate. These particles are very well dispersed at the surface of the substrate or support. This excellent dispersion is especially linked to the small nanoscale (nanometric) size of the particles deposited by the process of the invention.

The size is defined by the largest dimension of the dispersed particles; in the case of spherical or approximately spherical particles, the size is defined by the diameter of the particles.

The term "nanoscale (nanometric)" is understood to mean that the particles deposited by the process of the invention generally have a size of 1 to 400 nm, preferably of 1 to 200 nm, more preferably of 1 to 100 nm, better still from 5 to 50 nm.

It may also be said that the process according to the invention makes it possible to prepare (in certain cases) porous discontinuous films that are in the form of metallic islands, for example made of silver, of nanoscale size that are very well dispersed at the surface of the substrate, the meaning of the term "nanoscale size" having already been defined above.

A porous discontinuous film is obtained in the case where a certain coalescence of the particles is observed.

In all the cases, a continuous film is not obtained according to the invention, but rather a deposition of dispersed individual, especially silver, particles is obtained that optionally join together via a coalescence phenomenon to then form aggregates of larger size so that the deposition may then be qualified as a porous or discontinuous film, with a portion of the surface of the substrate that is still free from deposition of particles and which remains exposed.

It has been surprisingly demonstrated, according to the invention, that the fact of carrying out the deposition in the presence of a specific atmosphere comprising a majority volume proportion of oxidizing gas astonishingly resulted, especially in the case of silver, in the formation of particles, especially silver particles, and not of a continuous film, these particles having, in addition, a specific nanoscale size that is much smaller than in certain processes of the prior art. Consequently, these particles, especially silver particles, have, in addition, a dispersion on the substrate that is much greater than in the prior art.

Nothing may possibly lead to assuming on reading the prior art, especially regarding the deposition of silver particles, that by using the specific gas atmosphere of the process according to the invention, it would be possible to obtain, instead of a continuous uniform deposition, a deposition in the form of particles, especially silver particles, of specific, small, nanoscale size, these particles being, in addition, very well dispersed.

By way of example, the density of the deposition of the nanoparticles according to the invention is generally from 10 to 500 particles per $\mu m^2$, preferably from 50 to 200 particles per $\mu m^2$.

Besides the specific advantages of the process of the invention mentioned above, the process according to the invention also has all the inherent advantages of the OMCVD process: the deposition is possible on any substrate whatever the, even very complex, geometry of this substrate, whatever its surface finish, smooth or rough, and whatever the nature of the material forming the substrate, indeed, the deposition being carried out at relatively low temperature, for example, below 300° C., even substrates made from heat-sensitive materials may receive a deposit by the process of the invention.

For example, the process according to the invention enables the deposition of metal or metal alloy particles, for example silver alloy particles or silver particles, on substrates having geometries that are as complex as those used in the field for treating gas effluents, which are, for example, in the form of ceramic honeycombs or foams.

The process according to the invention is easy to implement industrially, does not generally require high vacuum, and is not very polluting, in particular when compared with processes such as electrodeposition.

The nanoparticles dispersed according to the invention are, in particular, metal, especially silver, nanoparticles with optional incorporation of carbon and/or oxygen, or metal alloy, for example silver alloy, nanoparticles with the same optional incorporation of carbon and/or oxygen.

The metal alloy may be chosen from alloys of a first metal as defined above with at least one element chosen from the other, optionally oxidized, metals (different from the first metal), and carbon.

Thus, the silver alloy may be chosen from the alloys of silver with at least one element chosen from the other, optionally oxidized, metals (different from Ag), and carbon.

Another advantage of the process according to the invention is its great flexibility as it may indeed deposit, besides silver, practically all types of metals or oxides of those metals. Therefore a wide range of choice is available as regards the choice of the optional alloyed element: carbon, metal that may or may not be a noble metal and may or may not be oxidized.

Preferably, the other metals alloyed to silver are chosen from the noble metals such as platinum, palladium, rhodium and iridium.

It is possible according to the invention to prepare particles of binary alloys, for example of Ag/Rh, particles of ternary alloys, such as Ag/Pt/Rh, and composite particles comprising at least one metal and at least one oxide.

Said oxide may possibly be chosen from the oxides already mentioned above, such as the oxides of alkali metals, alkaline-earth metals, transition metals, or rare-earth metals. Furthermore, it is possible according to the process of the invention to deposit only particles of a single metal or else it is possible to deposit simultaneously several different particles, each of which is composed of a different metal or alloy.

The precursors are generally organometallic compounds (whether they are precursors of the metal or metals, such as silver, or optional precursors of the other metals forming an alloy with silver) which may be solid or liquid. Other precursors are, in particular, metal nitrates.

The organometallic precursors are generally chosen from metal carboxylates and metal β-diketonates.

It is clearly apparent that when it is desired to prepare silver or silver alloy nanoparticles, the organometallic precursors then compulsorily comprise at least one silver precursor.

For example, the silver precursor is generally chosen from silver carboxylates of formula $RCO_2Ag$, in which R represents a linear or branched alkyl group having 1 to 10 carbon atoms, preferably 3 to 7 carbon atoms; and silver β-diketonates such as silver tetramethylheptanedionate.

Preferably, the silver precursor is silver pivalate.

Advantageously, the organometallic precursor or precursors are used in the form of a solution of this or these precursor(s) in an organic solvent which is generally injected into a sealed chamber where the substrate is positioned.

The concentration of the precursor or precursors in the solution is generally from 0.01 to 0.6 mol/l.

Said solution, in the case where the solution contains at least one silver precursor, may advantageously comprise an amine and/or a nitrile in order to make it easier to dissolve the silver precursor or precursors.

The concentration of the amine and/or of the nitrile in the solution is generally greater than 0.1 vol %, preferably this amine and/or nitrile concentration is from 0.5 to 10 vol %.

The solvent of said solution is generally chosen from the solvents whose evaporation temperature is below the decomposition temperature of the precursor or precursors.

The solvent is preferably chosen from organic compounds that are liquid at room temperature and up to 200° C. under standard pressure conditions such as mesitylene, cyclohexane, xylene, toluene, n-octane, acetylacetone, ethanol; water; and mixtures thereof.

The amine optionally included in the solution is generally chosen from primary, secondary or tertiary monoamines such as n-hexylamine, isobutylamine, di-sec-butylamine, triethylamine, benzylamine, ethanolamine and diisopropylamine; polyamines; and mixtures thereof.

The nitrile optionally included in the solution is generally chosen from acetonitrile, valeronitrile, benzonitrile and propionitrile and mixtures thereof.

The deposition is generally carried out at a low temperature, that is to say at a substrate temperature less than or equal to 500° C., preferably less than or equal to 400° C., more preferably less than or equal to 300° C., better still from 250 to 290° C.

This is one additional advantage of the process according to the invention, that of making it possible to deposit particles at a low temperature that is compatible with a large number of substrates.

The deposition may be carried out at atmospheric pressure but it may also be carried out under vacuum, for example at a pressure of 300 to 1000 Pa, which is not a very high vacuum, which is easy to produce.

The deposition time is generally from 2 to 90 minutes, preferably from 5 to 30 minutes.

The deposition may advantageously be plasma-assisted or plasma-enhanced, such as "LF", "RF" or "pulsed DC" plasma excitation.

The substrate is generally chosen from porous substrates and dense substrates.

The substrate is generally of (made of) a material chosen from ceramics such as alumina, ceria, zirconia; silicon; zeolites; steel; and fabrics.

The invention also relates to a substrate comprising at least one surface on which nanoparticles of (made of) a metal or of an alloy of said metal are dispersed, the metal being chosen from the metals from columns VIIIB and IB of the Periodic Table. Said metal is preferably chosen from Ag, Rh, Pt, Pd and Ir.

In the case of an alloy, said alloy is preferably chosen from the alloys of metals from columns VIIIB and IB of the Periodic Table such as Ag, Rh, Pd, Pt and Ir with one another.

In particular, the invention relates to a substrate comprising at least one surface on which silver or silver alloy nanoparticles are dispersed.

Carbon and/or oxygen may optionally be incorporated into said particles, for example, in an amount of 1 at %.

Generally, said dispersed nanoparticles have a size of 1 to 400 nm, preferably of 1 to 200 nm, more preferably from 1 to 100 nm, better still from 5 to 50 nm.

Generally, said nanoparticles have a density on the surface of the substrate of 10 to 500 per $\mu m^2$, preferably of 50 to 200 per $\mu m^2$.

It is possible that some of the particles join together to thus form a discontinuous porous film on the surface of the substrate.

Substrates having, on at least one of their surfaces, dispersed nanoscale (nanometric) metal or metal alloy particles and especially nanoscale silver or silver alloy particles are not described in the prior art and are intrinsically novel.

Said substrates may be used as components of optical or electronic devices but their preferred use is in the field of catalysis. Due especially to the high dispersion of the particles and their small size, the substrates according to the invention that may be defined as nanostructured catalysts have a very high catalytic activity, greater than the catalysts of the prior art, especially the silver-based catalysts of the prior art which are not very well dispersed and are not very active.

This catalytic activity is present even at low temperature. In fact, the catalysts constituted by the substrates according to the invention, in particular in the case where they are based on silver, may have an activity that is comparable to that of platinum-based catalysts but with the decisive advantage that silver is much less expensive and much less rare than platinum.

In other words, the advantageous properties of the substrates and in particular of the substrates acting as catalyst according to the invention stem intrinsically from the process for preparing, for depositing, nanoparticles according to the invention.

These advantageous properties of the substrates according to the invention, in particular substrates acting as catalyst according to the invention, ensue, especially, from the nanostructuring induced by the synthesis process according to the invention.

This is because the synthesis of nanostructured materials via the chemical vapour deposition process makes it possible to very strongly increase the catalytic effectiveness by increasing, by several orders of magnitude, the number of active sites and by forming mixed compounds, such as alloys and composites which are defined more easily than by conventional preparation processes. The ability, on the one hand, to localize the catalyst in the volume of the parts and, on the other hand, to disperse it on a nanoscale furthermore enables a significant drop in the catalyst loading level, which may be, for example, of the order of 10 times lower relative to a conventional process such as impregnation, and therefore enables a decrease in the cost of the devices, especially for those using noble metals such as platinum, rhodium, etc.

By realizing this, the process according to the invention and the substrates prepared by this process may make it possible to envisage a technology jump by combining the following advantages:

decreasing the cost of the catalytic system: the ability, on the one hand, to significantly decrease the catalyst loading level and, on the other hand, to work on the chemical nature of the systems involved (replacing noble metals with non-noble metals or oxides) makes it possible to significantly lower the cost of the system (with an expected saving of around 5%);

decreasing the energy costs: the results from characterizations carried out on nanostructured catalysts deposited by CVD make it possible to think that the catalytic effectiveness in terms of yield and selectivity and also in terms of activation temperature of the catalytic reactions (temperature decrease of at least 100° C.) will be widely improved relative to the existing technologies, thus decreasing the energy costs: by way of example, the fact of initiating the oxidation reactions of NO to $NO_2$ at temperatures close to 200° C. has the direct result of drastically reducing the fuel consumption and the production of $CO_2$: by way of indication, a decrease of around 50% of the surplus fuel consumption may be expected;

gain in terms of lifetime: another advantage of a low reaction temperature, apart from the lower energy expenditure, is the limited deactivation of the catalysts by preventing their sintering or their thermal degradation.

Consequently, the invention also relates to the use of the substrate described above for catalysing a chemical reaction.

This chemical reaction may be any known reaction capable of being catalysed by a catalyst based on one of the metals or metal alloys cited above, such as silver.

It could be, for example, a reaction in the gas phase, such as a, preferably selective, oxidation reaction, such as oxidation of methanol, epoxidation of olefins, controlled (mild) oxidation of hydrocarbons, oxidation of CO, decomposition of $N_2O$, reforming of light alcohols such as methanol and ethanol, or a gas reforming, for example, in fuel cells, or a reaction for depolluting air.

It could be a reaction in the liquid phase, especially in the aqueous phase, for example for depolluting water.

The substrates according to the invention may also be used as membranes for hydrogen permeation, for catalysing hydrogenation/dehydrogenation reactions, or for catalysing other reactions that take place, for example, in fuel cells.

A preferred use of the substrate described above is in the catalysis of a chemical reaction which is a decomposition reaction, for removing nitrogen oxides, such as $NO_x$ or NO by oxidation and/or reduction.

Indeed, the substrate according to the invention provides high-performance catalytic systems that make it possible to significantly increase the catalytic efficiency of $NO_x$ elimination reactions, for example during reactions implemented in catalysts known as "$NO_x$ traps" for automotive vehicles.

Indeed, the substrates according to the invention which, as has already been indicated above, may be defined as "nanostructured catalysts" based on a noble metal element such as Pt, Pd, Rh, Ir, etc. and/or a non-noble metal element, such as Ag, may or may not be enclosed in an oxide matrix (oxide of an alkali metal or an alkaline-earth metal such as Ca, Sr, Ba, K or Na or an oxide of a transition metal, such as Mn, Fe, Co, Ni or an oxide of rare-earth metals, such as Ce or Pr), or may be combined with a zeolite, enable the elimination of nitrogen oxygen emissions at low temperature, for example below 300° C., and therefore find a direct application as catalysts in processes such as:

the elimination of $NO_x$ stemming from stationary sources (incinerators, cement works, glass works, power stations, etc.) by the ammonia-SCR process on zeolite materials, in order to obtain a good $NO_2$ content;

the elimination of $NO_2$ stemming from mobile sources via an H—SCR process, where the metal nanoparticles may easily oxidize the reducing agent thus rendering it active and, at the same time, generating the abovementioned more oxidized and more reactive $NO_x$ species; and the elimination of $NO_x$ stemming from mobile sources via a $NO_x$ trap process, where the metal nanoparticles may easily oxidize the $NO_x$ to nitrates, even at low temperature.

The invention will now be described in more detail in the description that follows, given by way of illustration and non-limitingly, made with reference to the appended drawings, in which:

FIGS. 1 and 2 are micrographs taken using scanning electron microscopy (FEG-SEM) showing silver nanoparticles prepared by the process according to the invention on a flat silicon substrate under the conditions from Example 1.

The two figures show the same sample but at different magnifications, namely at 100 000 (FIG. 1) and 50 000 (FIG. 2) magnifications respectively.

The scale shown in FIG. 1 is 100 nm, the scale shown in FIG. 2 is 1 µm;

FIGS. 3 and 4 are micrographs taken using scanning electron microscopy (FEG-SEM) showing silver nanoparticles prepared by the process according to the invention on a porous substrate made from alumina-zirconia ceramic foam having 20 ppi (pores per inch), under the conditions from Example 1.

The two figures show the same sample but at different magnifications, namely at 50 000 (FIG. 3) and 50 520 (FIG. 4) magnifications respectively. The scale shown in FIG. 3 is 300 nm, whereas the scale shown in FIG. 4 is 1 µm;

FIGS. 5 and 6 are micrographs taken using scanning electron microscopy (FEG-SEM) showing silver nanoparticles prepared by the process according to the invention on a flat silicon substrate under the conditions from Example 2.

The two figures show the same sample but at different magnifications, namely at 100 000 (FIG. 5) and 200 000 (FIG. 6) magnifications respectively. The scale shown in FIG. 5 is 200 nm and the scale shown in FIG. 6 is also 200 nm;

FIGS. 7, 8 and 9 are micrographs taken using scanning electron microscopy (FEG-SEM) showing silver nanoparticles prepared by the process according to the invention on a porous substrate made from an alumina-zirconia ceramic foam having 20 ppi, under the conditions from Example 2.

The three figures show the same sample but at different magnifications, namely at 10 000 (FIG. 7), 50 000 (FIG. 8) and 200 000 (FIG. 9) magnifications.

FIG. 8 is a magnification of the box shown in FIG. 7 and FIG. 9 is a magnification of the box shown in FIG. 8.

The scales shown in FIGS. 7, 8 and 9 are 1 µm, 200 nm and 100 nm respectively;

FIG. 10 is a graph that represents the X-ray diffraction diagrams of the deposits obtained in accordance with the process of the invention in Examples 1 (top curve) and 2 (bottom curve).

The y-axis represents I (cps): the intensity in counts per second and the x-axis represents 2θ(°): the diffraction angle;

FIG. 11 is a graph that gives the RBS spectra of silver films deposited on silicon substrates in accordance with the invention by OMCVD under the conditions of Example 1 with an oxidizing atmosphere composed of 10% $N_2$ and 90% $O_2$, or under the conditions of Example 1 but with a reducing atmosphere composed of 85 vol % $N_2$ and 15 vol % $H_2$ (bottom curve). The y-axis represents the intensity I (in arbitrary units, a.u.) and the x-axis represents the energy (E) in keV;

Figure 14:
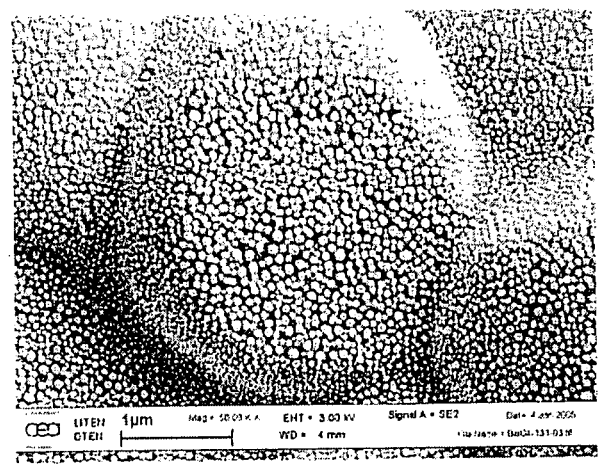
Figure 15:
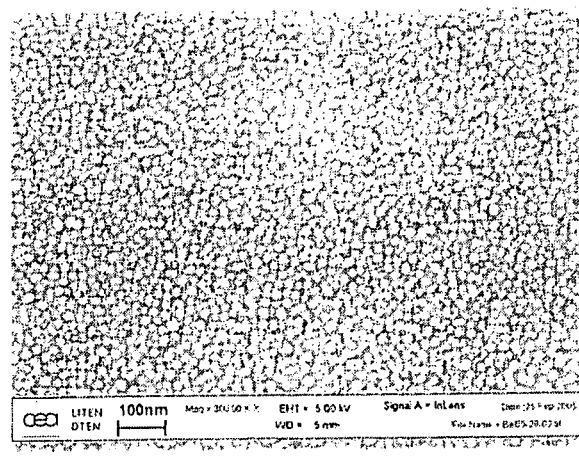

FIGS. 14 and 15 are micrographs taken using scanning electron microscopy (FEG-SEM) respectively showing silver nanoparticles prepared by the process according to the invention on a porous substrate made from alumina-zirconia ceramic foam with 20 ppi, under the conditions of Example 6 (FIG. 14) and silver nanoparticles prepared by the process according to the invention on a flat silicon substrate under the conditions of Example 7 (FIG. 15).

Figure 16:
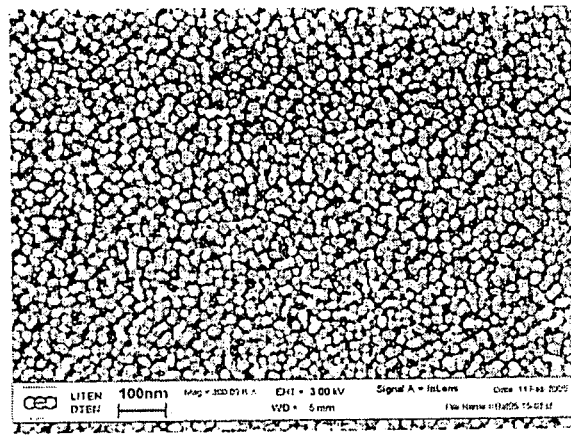

The scales shown on FIGS. 14 and 15 are 1 µm and 100 nm respectively;

FIG. 16 is a micrograph taken using scanning electron microscopy (FEG-SEM) showing platinum particles prepared by the process according to the invention on a flat silicon substrate under the conditions of Example 9.

Figure 17A:
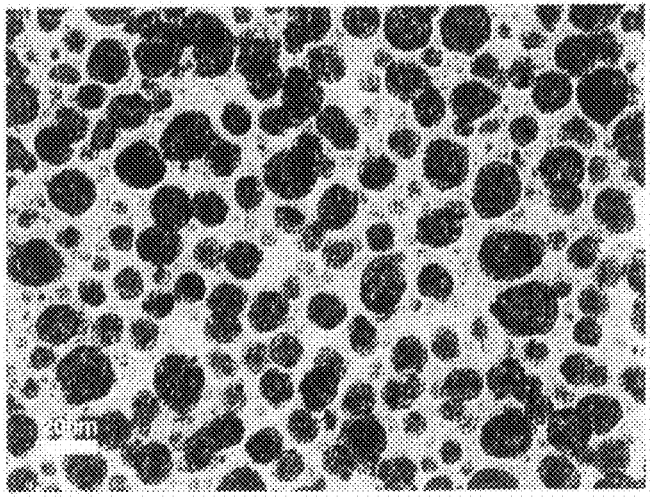

The scale shown in FIG. 16 is 100 nm;

FIG. 17 is a micrograph taken using transmission electron microscopy (TEM) of an Ag—Rh bimetallic deposit on a silicon substrate produced by the process according to the invention under the conditions of Example 10.

Figure 18:
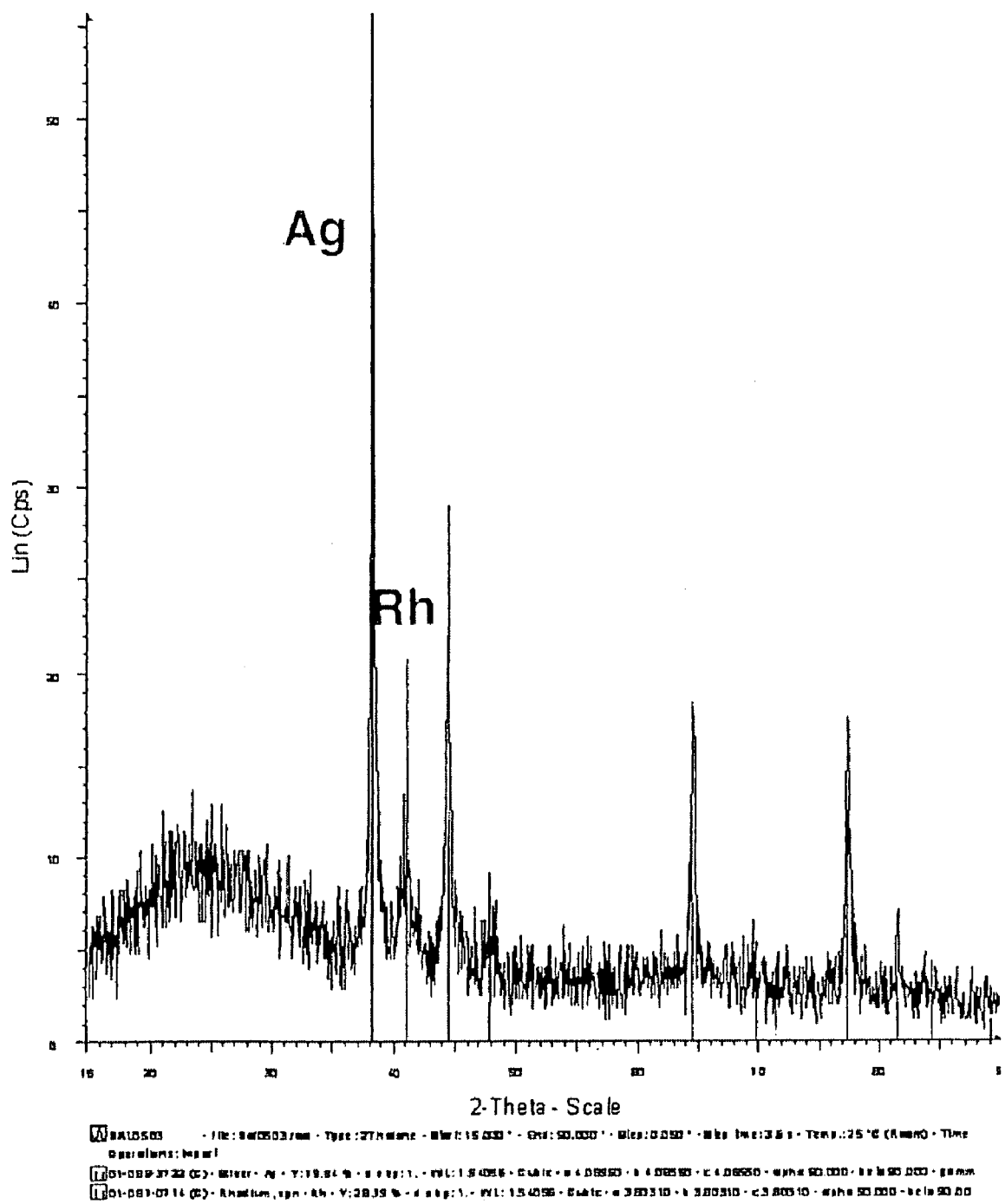

The scale shown in FIG. 17 is 20 nm;

FIG. 18 represents the X-ray diffraction spectrum of the Ag—Rh bimetallic deposit on a silicon substrate produced by the process according to the invention under the conditions of Example 10.

The y-axis represents Lin (Cps) and the x-axis represents 2θ; and

FIG. 19 represents the FTIR spectra of the gas phase (19A) and of the absorbed phase (19B) during treatment of a flow of $P_{NO}$ (1000 ppm) and $P_{O_2}$=10% at ambient temperature BY the surface coated with silver nanoparticles prepared in Example 1.

The y-axis represents the absorbance and the x-axis represents the wavenumber (cm$^{-1}$).

More specifically, for implementing the process according to the invention, the composition generally in liquid form containing the precursor or precursors is generally first sent into a vaporization device or vaporizer.

The composition containing the precursor or precursors is preferably, as has been indicated above, in the form of a solution of the precursor or precursors in a solvent, said solution preferably comprising a nitrile and/or an amine to promote the dissolution of the precursor in the solution when the precursor in question is a silver precursor.

Said precursor or precursors are generally organometallic compounds. The term "organometallic compounds" is understood to also mean metal nitrates. The solution may contain only a single precursor which is then, for example, a silver organometallic compound. If the solution contains several precursors then one of these precursors may be a precursor of a first metal, for example a silver organometallic compound, and the other precursor or precursors are organometallic compounds of other metals that are different from the first metal, for example different from silver in order to form, on the substrate, an alloy of this first metal, such as silver and of this other metal or of these other metals.

It has been seen above that the preferred organometallic precursors both of silver and of other metals are chosen from metal β-diketonates and carboxylates.

Thus, the preferred silver precursors will be chosen from silver β-diketonates and carboxylates. A silver precursor that is particularly preferred is silver pivalate which makes it possible to avoid the problems of low volatility encountered with precursors such as silver carboxylates Ag(O$_2$CR) where R is an alkyl group preferably having 3 to 7 carbon atoms, and also the problems of contamination generally encountered with fluorinated organometallic precursors.

On exiting the vaporization device, the composition, for example the solution, containing the precursors is introduced into a chamber that contains the substrate or support on which the deposition must be carried out.

The substrate or support may have any shape as the process according to the invention enables the deposition of metal particles, for example of silver particles, even on substrates that have a very complex geometry. The substrate may be chosen from porous substrates or from dense, non-porous substrates.

The substrate may have any surface finish, it may be rough or smooth.

The size of the substrate is not limited, both substrates of small and of large size may receive a deposit by the process of the invention.

The substrate may be made of any material, and even from a relatively heat-sensitive material thanks to the relatively low deposition temperatures used.

The substrate may be, for example, made of a material chosen from ceramics, silicon, zeolites, steel, or fabrics.

Before entering the vaporization device, the composition such as a solution is generally kept in a container at ambient temperature.

The vaporization of the precursor composition may be carried out using various devices known to a person skilled in the art.

As a preferred example, mention may be made of the device described in Chem. Mat. 13, 3993 (2001), sold by Jipelec under the name "InJect, System for injecting and evaporating liquid precursors that are pure or in the form of solutions". The temperature of the substrate to be coated, which is generally the same as the temperature in the deposition chamber and which may be defined as being the deposition temperature, is, according to the invention, generally a relatively low temperature, namely less than or equal to 500° C., preferably less than or equal to 300° C., for example 280° C.

Such a low temperature has the advantage of enabling the deposition of silver particles onto substrates that are heat sensitive which would not have been possible via other processes operating at much higher temperatures.

The deposition chamber is composed of a sealed reactor and container, in which there is an atmosphere composed of a gas called a reaction gas comprising predominantly (by volume), according to the invention, a reactive oxidizing gas.

Inside the deposition chamber atmospheric pressure may be established or a pressure below that (chamber under vacuum), for example a pressure less than or equal to 15 torr.

The process according to the invention may advantageously be plasma-enhanced or plasma-assisted.

The plasma-enhanced techniques are complementary to the chemical vapour deposition processes using organometallic precursors in the sense that they also use low reaction temperatures (techniques known as PA- or PE-CVD, namely plasma-assisted or plasma-enhanced chemical vapour deposition).

The type of plasma excitation may be chosen, for example, from low frequency (LF), radiofrequency (RF) or pulsed direct current (pulsed DC) plasma excitation.

The plasma enhancement makes it possible to offer additional surface-structuring possibilities.

A cold plasma may therefore optionally be added around the support. When the deposition is carried out in the presence of a plasma, it is sufficient that the support or substrate intended to receive the metal or metal alloy nanoparticles, for example silver or silver alloy nanoparticles, is kept at the same temperature that is in the evaporator. In the absence of a plasma, it is necessary that said support be at a temperature greater than that of the evaporator, the temperature difference being at least equal to 20° C., preferably at least equal to 50° C., in order to prevent the deposition of silver on the walls of the reactor.

The change in the surface energies and the grain boundary induced by the use of the oxidizing gas, according to the invention, makes it possible to develop depositions of dispersed metal or metal alloy, for example silver or silver alloy, nanoparticles, for example discontinuous films, at the relatively low deposition temperatures defined above.

As has already been indicated above, the deposit obtained by the process according to the invention may especially be defined as a porous film being in the form of metallic islands of nanoscale size, that is to say generally having a dimension, for example a diameter, of 1 to 400 nm, that are well dispersed on the surface of the substrate or support whether the latter is dense or porous, which gives them a large active surface area, an essential component for catalytic applications for example.

The composition, the morphology and in particular the porosity of the deposits of metal or metal alloy nanoparticles, for example of silver nanoparticles or of silver alloy nanoparticles, carried out by the process of the invention may be regulated or adjusted by acting on certain parameters such as the nature and the flow of the reactive gas, the amount of precursor, the temperature and the pressure, on the condition however that the gas in whose presence the deposition is carried out always contains a predominant volume proportion of oxidizing gas, with especially a oxidizing gas/inert gas flow rates ratio>1.

The implementation of the process of the invention makes it possible to obtain nanoparticles based on metal, for example based on silver, having a good adhesion to the supports on which they have been deposited. The size of the nanoparticles varies depending on the process parameters and especially depending on the oxidizing gas/inert gas flow ratio (always keeping this ratio>1), on the flow rate of the metal precursors and finally on the experiment time. In general, the films are non-conductive and visually have a matt appearance.

An installation that is particularly well suited to the implementation of the process according to the invention and which is that used in the above examples comprises a vaporization device of the type "InJect" cited above, sold by Jipelec which is coupled to a chemical vapour deposition chamber.

The "InJect" device comprises four main parts:
the container or containers for storing the chemical solution or solutions of precursors; in the case where the nanoparticles are composed of a single metal, a single storage container is provided; in the case of alloys where the organometallic precursors cannot be dissolved in a common solvent, several storage containers are used;
one or more injector(s), for example of the petrol or diesel engine injector type connected by one or more lines or conduits for supplying liquid to the storage container(s) and which is driven by an electronic control device;
a line or conduit for supplying a carrier gas or a neutral inert carrier (for example nitrogen); and
a vaporization device (evaporator).

The chemical vapour deposition chamber, which contains the substrate to be coated, comprises heating means, a supply of reactive oxidizing gas such as oxygen, and means for pumping and regulating the pressure, or reduced pressure if operating under vacuum. The evaporator is connected to the chemical vapour deposition chamber by a conduit that is equipped with heating means and that is kept at the same temperature as the evaporator.

The chemical vapour deposition chamber and the substrate to be coated which is placed therein are generally kept at a temperature above that of the evaporator in order to create a positive thermal gradient. The chemical solution containing a silver precursor is introduced into the pressurized container kept at a pressure, for example, of 1 bar or 2 bar, then sent from said container, through the injector(s) (by the pressure difference) into the evaporator which is kept under vacuum. The injection flow rate is controlled by acting on the opening time and frequency of the injector(s) that can be considered to be a microsolenoid valve and which is controlled by a computer.

The chemical reaction is carried out in the presence of a reaction gas composed of a reactive gas such as $O_2$, $H_2$ or $CO_2$ and under a pressure generally less than or equal to 2000 Pa.

Especially due to the chemical nature (at least one noble metal that is silver and optionally several) and the morphology (large number of very well dispersed active sites of nanoscale size) of the nanomaterials according to the invention (that is to say the substrates on which the silver or silver alloy nanoelectric particles are dispersed), they appear to be choice candidates in the fields of electronics, optics and especially catalysis, for example for environmental protection. By way of example, they thus find direct applications for oxidizing in the gas phase (depolluting air) and oxidizing in the aqueous phase (depolluting water), but they may also be used as membranes for hydrogen permeation (reforming gases for fuel cells, hydrogenation/dehydrogenation) or else make it possible to catalyse other reactions in the field of fuel cells.

The invention will now be described with reference to the following examples, given by way of illustration and non-limitingly.

EXAMPLES 1 AND 2

In these examples, the deposition of silver particles on a porous ceramic substrate composed of an alumina-zirconia foam with 20 ppi (pores per inch) or on a flat substrate composed of a silicon wafer, was carried out.

The depositions were carried out using an "InJect" vaporization device coupled to a deposition chamber as described above.

The depositions were carried out from a solution comprising the organometallic precursor, silver pivalate AgPiV (Ag(tBuCO$_2$)), dissolved in a solvent which was mesitylene, to which diisopropylamine (iPr$_2$NH or [(CH$_3$)$_2$CH]$_2$NH) was added to promote the dissolution. The final precursor concentration was 0.05 mol/l.

The temperatures of the evaporator and of the substrate were fixed respectively at 170 and 280° C.

The other operating conditions of these two examples are given in Table 1 below:

TABLE 1

| | Injector frequency (Hz) | Injector opening time (ms) | $N_2/O_2$ flows (cc) | Pressure (torr) | Deposition time (min) |
|---|---|---|---|---|---|
| Example 1 | 2 | 2 | 18/162 | 6.5 | 60 |
| Example 2 | 1 | 2 | 36/144 | 8 | 60 |

EXAMPLE 3

In this example, by way of comparison a deposition of silver was carried out by the chemical vapour deposition (CVD) technique on the same substrates as those from Examples 1 and 2 and under the following conditions:
silver target: bias voltage: −100 V;
pressure: 1 Pa;
gas: argon; and
power on target: 10 W/cm$^2$.

EXAMPLE 4

In this example, by way of comparison a deposition of silver was carried out by a chemical vapour deposition technique under the same conditions and with the same device as in Example 1 with the only difference that the deposition was carried out under a reducing atmosphere composed of 15 vol % of hydrogen and 85 vol % of nitrogen.

Characterization of the Depositions Carried Out in Examples 1 to 4

Characterization of the Depositions from Examples 1 and 2 by Scanning Electron Microscopy In the case of Example 1 (FIGS. 1, 2, 3 and 4), a deposition composed of silver nanoparticles of 50 to 100 nm in diameter, of which some had undergone the start of coalescence, which was expressed by the formation of aggregates of several hundreds of nm in diameter, was obtained. The density of the nanoparticles was in this example close to $0.3 \times 10^{11}$ per cm$^2$.

In the case of Example 2 (FIGS. 5, 6, 7, 8 and 9), a deposition composed of non-coalesced silver nanoparticles of 5 to 50 nm in diameter was obtained; the density of the nanoparticles was in this case close to $10^{12}$ per $cm^2$.

Figure 7:
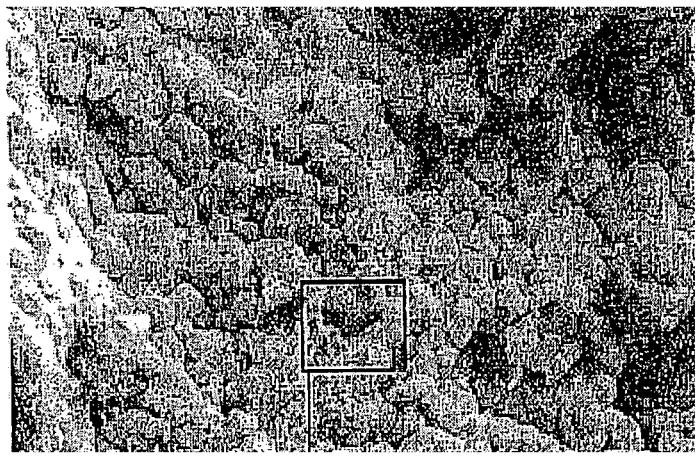
Figure 8:
Figure 9:
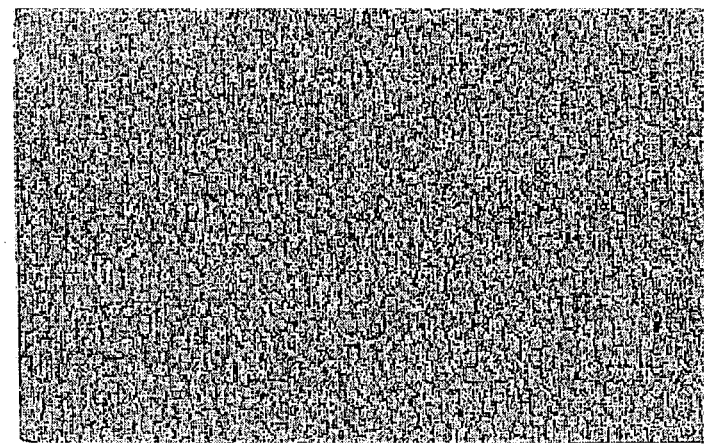
Figure 10:
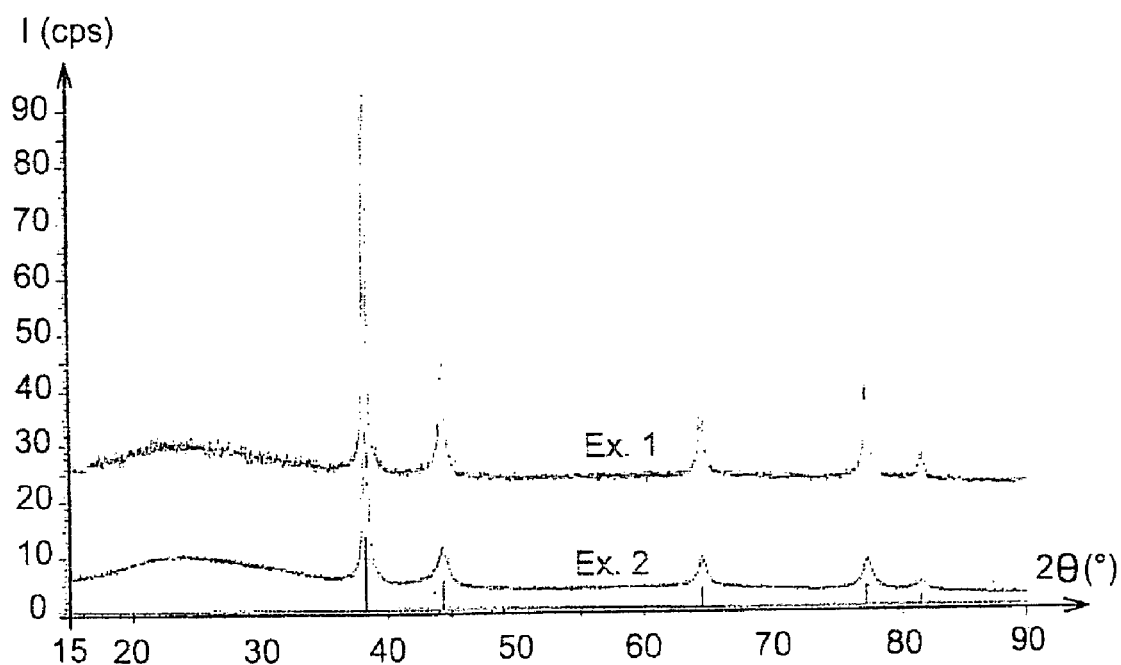
Figure 11:
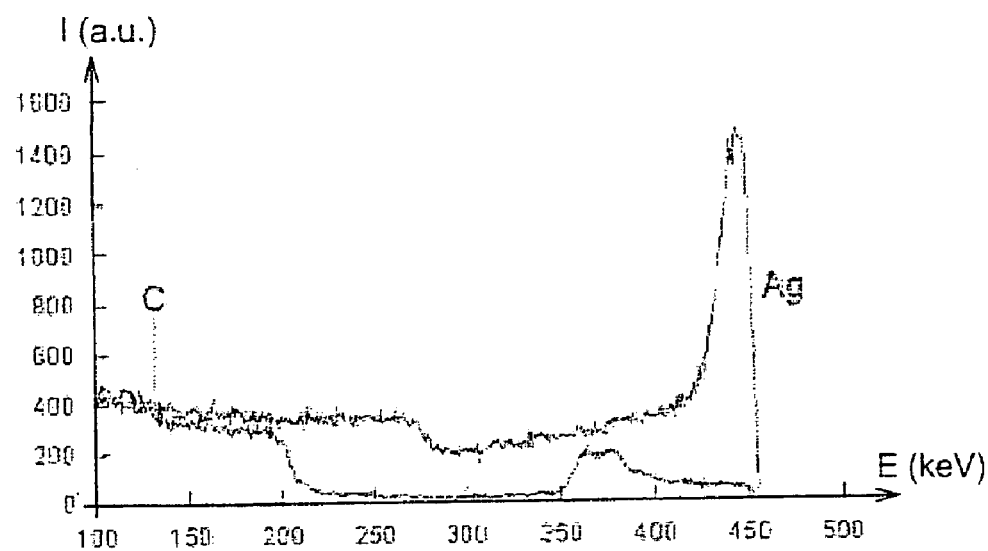
Figure 12:
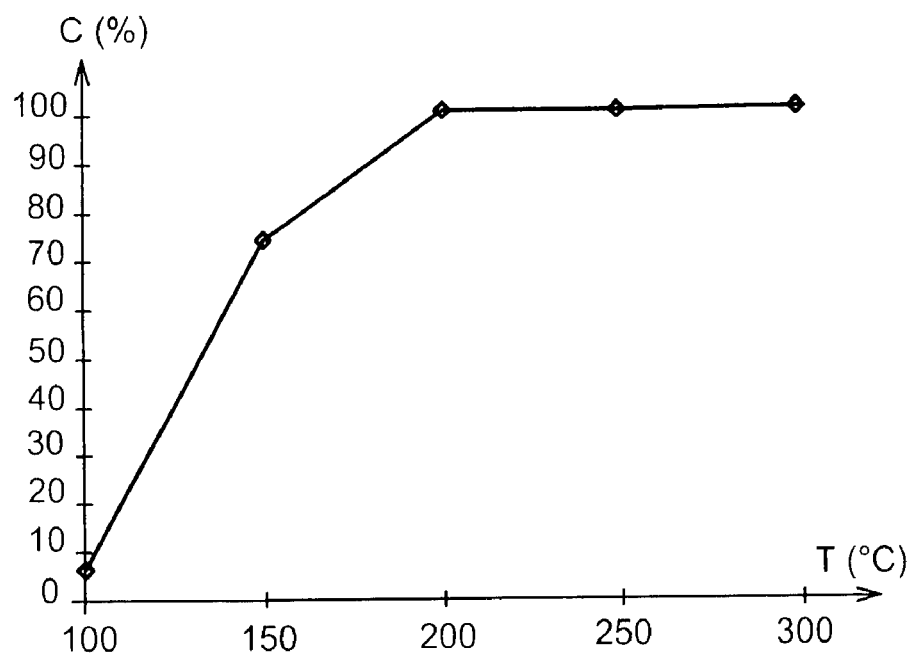
FIG. 12 is a graph that gives the conversion C of the methanol (%) as a function of the temperature T (° C.) in a process for converting methanol using the silver film deposited by OMCVD on a porous ceramic substrate (alumina-zirconia foam, 20 ppi) under the conditions from Example 1, in the presence of a gas composed of 10% $N_2$ and 90% $O_2$.
Figure 13:
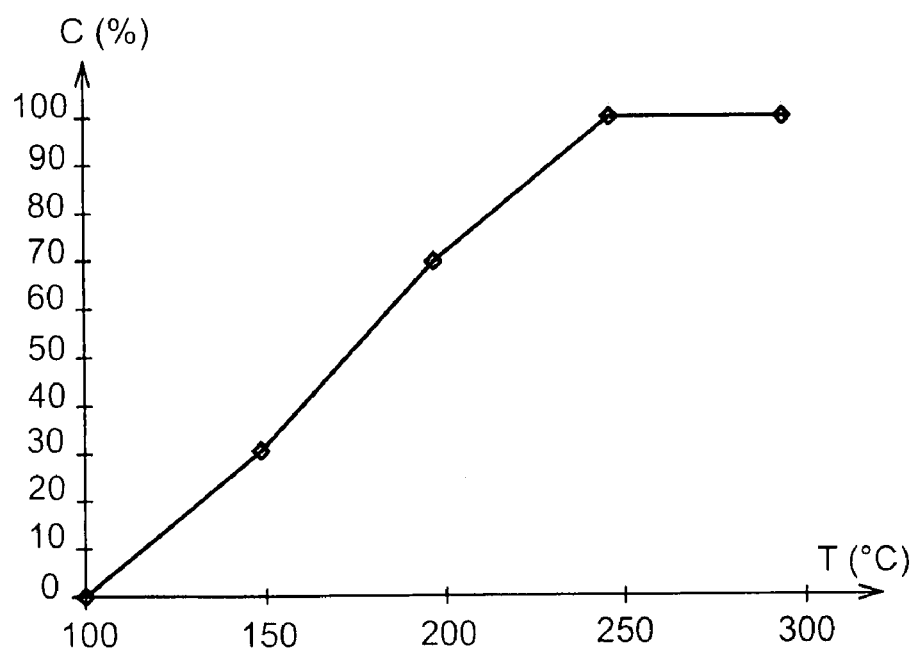
FIG. 13 is a graph that gives the conversion (C) to $CO_2$ (%) as a function of the temperature T (° C.) in a process for converting methanol using the same silver film as mentioned above for FIG. 2.

For both examples, the depositions thus formed were adherent, non-conductive and crystallized in the fcc structure as can be seen in the X-ray diffraction diagrams of the depositions obtained, given in FIG. 10 (top: Example 1, bottom: Example 2).

Furthermore; the nanoparticles were well dispersed, this being so regardless of the nature or the geometry of the substrate, and whether it was flat and made of Si or porous and made of ceramic foam.

In the case of the porous substrate, the deposition had completely infiltrated the structure with the presence of nanoparticles inside the pores.

Characterization of the Depositions Carried Out in Examples 1, 2, 3 and 4 by Rutherford Backscattering Spectrometry (RBS)

The RBS spectrum of the deposition carried out under the conditions of Example 1, according to the invention under an oxidizing atmosphere (90% $O_2$), had a large silver peak at the surface which decreased until the silicon peak where the two peaks overlapped: this made it possible to tell that the deposition was not homogeneous and was in the form of silver islands leaving part of the silicon surface in direct contact with the beam. The RBS technique furthermore made it possible to demonstrate a small carbon contamination over the whole thickness of the film (of the order of 1 at %), this element was not detected in the case of the depositions carried out by PVD (Example 3).

The deposition carried out under the same conditions as in Example 1 but under a reducing atmosphere (15% $H_2$) (Example 4) had a characteristic silver peak of a lower intensity. It appeared thicker and had a slight concentration gradient between the surface and the interface and a higher carbon contamination (of the order of 10 at %). The presence of the element carbon was mainly derived from the decomposition of the precursors and solvents.

N. B. : A test was carried out with a minor proportion of $O_2$, but it was impossible to characterize because there was too little deposition.

EXAMPLE 5

In this example, the catalytic efficiency was tested of the two depositions carried out by OMCVD, with different atmospheres, in Examples 1 (according to the invention) and 4 (not according to the invention). This catalytic efficiency was tested in a gas phase oxidation procedure, and more particularly on the oxidation reaction of methanol.

The deposition carried out under a reducing atmosphere (Example 4, not according to the invention) had zero catalytic activity, only the results from the test carried out under an oxidizing atmosphere with the silver deposition carried out in Example 1 (according to the invention) are given (Tables 2 and 3). This result was very demonstrative as, contrary to the usual silver-based catalysts that are not very well dispersed and are not very active, a catalytic activity was observed here from 100° C., a result that is comparable with that generally obtained with a catalyst made from platinum which is a rarer and more expensive material.

Even if the conversion of methanol is only partial at low temperature—which moreover allows other selective oxidation applications to be anticipated, such as, for example, epoxidation of olefins, controlled oxidation of hydrocarbons, oxidation of CO, decomposition of $N_2O$, reforming of light alcohols such as methanol and ethanol—this conversion shows, without ambiguity, that the efficiency of this catalyst prepared according to the process of the invention is high, a result of a lower particle size and therefore of a much greater dispersion.

Tables 2 and 3: Catalytic Efficiency in the Methanol Conversion Process of the Silver Film Deposited by OMCVD on a Porous Ceramic Substrate (Alumina-Zirconia Foam, 20 ppi) Under the Operating Conditions of Example 1 (10% $N_2$, 90% $O_2$) According to the Invention

TABLE 2

| Catalyst | Temperature (° C.) | 100 | 150 | 200 | 250 | 300 |
|---|---|---|---|---|---|---|
| Example 1 | Conversion of methanol (%) | 6 | 74 | 100 | 100 | 100 |
| | Conversion to $CO_2$ (%) | 0 | 30 | 70 | 100 | 100 |
| | Conversion to $CH_3OCH_3$ (%) | 0 | 8 | 2 | 0 | 0 |
| | Conversion to $CH_2O$ (%) | 0 | 1 | 1 | 0 | 0 |
| | Conversion to HCOOH (%) | 0 | 26 | 21 | 0 | 0 |

TABLE 3

| | Conversion temperature of methanol | | | $CO_2$ selectivity | |
|---|---|---|---|---|---|
| Example | $T_0$ | $T_{1/2}$ | $T_1$ | $S_{1/2}$ | $S_1$ |
| 1 | 100 | 135 | 200 | 0 | 70% |

EXAMPLES 6 TO 10

In the deposition examples that follow, the deposition of nanoparticles of catalysts composed of a metal: Ag, Rh or Pt, or of an Ag/Rh metal alloy were carried out on a porous ceramic substrate which was, for example, an alumina-zirconia foam with 20 ppi, or an alumina-ceria honeycomb with 400 cpsi, or else a flat substrate that was a silicon wafer. More specifically, in Example 6, the substrate was a porous substrate made of alumina-zirconia ceramic foam with 20 ppi, in Example 7, the substrate was a flat silicon substrate, in Example 9, the substrate was a flat silicon substrate, and in Example 10, the substrate was a silicon substrate.

The depositions were carried out using an "InJect" vaporization device coupled to a deposition chamber as described above.

The depositions were carried out from a chemical solution comprising the organometallic precursor(s). The chemical solutions used in the examples were the following:

for silver: silver pivalate AgPiV (Ag(tBuCO$_2$)), dissolved in a solvent (mesitylene), to which the molecule diisopropylamine (iPr$_2$NH=[(CH$_3$)$_2$CH]$_2$NH) was added to promote the dissolution. The final precursor concentration was 0.05 mol/l;

for palladium: palladium acetylacetonate Pd(C₅H₇O₂)₂ dissolved to a concentration of 0.03 mol/l in acetylacetone;

for platinum: platinum acetylacetonate Pt(C₅H₇O₂)₂ dissolved to a concentration of 0.02 mol/l in acetylacetone; and for rhodium: rhodium acetylacetonate Rh(C₅H₇O₂)₃ dissolved to a concentration of 0.02 mol/l in toluene.

The choice of solvent was made depending on the nature of the organometallic precursors: in the case of metal alloys (for example binary alloys such as Ag/Rh or ternary alloys such as Ag/Pt/Rh) or else metal/oxide (alkali metal or alkaline-earth metal oxide) composite alloys, the solvent may be common to the various precursors or else different (vaporization from several independent sources of precursors).

The temperatures of the evaporator and of the substrate were fixed respectively at 200 and 350° C. The other operating conditions of the examples are given in Table 4 below:

TABLE 4

| Example | Precursors | Injector(s) frequency (Hz) | Injector(s) opening time (ms) | Gas type and flow rates (cc) | Pressure (Pa) | Deposition time (min) |
|---|---|---|---|---|---|---|
| 6 | Silver | 2 | 2 | N₂/O₂ = 18/162 | 800 | 45 |
| 7 | Silver | 2 | 2 | N₂/O₂ = 18/162 | 800 | 15 |
| 8 | Rhodium | 2 | 2 | N₂/O₂ = 40/160 | 400 | 20 |
| 9 | Platinum | 2 | 2 | N₂/O₂ = 40/160 | 800 | 20 |
| 10 | Ag/Rh alloy | Ag: 2 Rh: 1 | Ag: 2 Rh: 2 | N₂/O₂ = 40/160 | 400 | 20 |

Characterization of the Depositions Carried Out in Examples 6 to 10

Characterization of the Deposits Carried Out in Examples 6, 7 and 9 (FIGS. 14, 15 and 16) by Scanning Electron Microscopy (FEG-SEM).

In the case of Example 6, FIG. 14, a deposit was obtained composed of silver nanoparticles of 50 to 100 nm in diameter, spaced at distances of about 40 nm, deposited on a macroporous support which was an alumina-zirconia ceramic foam with 20 ppi. The density of the nanoparticles was, in this example, close to 100 particles/µm². The catalyst loading level, estimated by chemical analysis, was about 0.020% (or about 200 µg/g).

In the case of Example 7, FIG. 15, a deposition was obtained composed of silver nanoparticles of 20 nm in diameter, spaced at distances of about 10 nm; the density of the nanoparticles was, in this case, close to 270 particles/µm². The catalyst loading level was about 0.010% (or about 100 µg/g).

In the case of Example 9, FIG. 16, a deposition was obtained composed of non-coalesced platinum nanoparticles; the density of the nanoparticles was in this case close to 170 particles/µm². The catalyst loading level was about 0.015% (or about 150 µg/g).

Characterization of the Deposition Carried Out in Example 10 by Transmission Electron Microscopy (TEM) and by X-ray Diffraction.

Figures 17B, 17C:
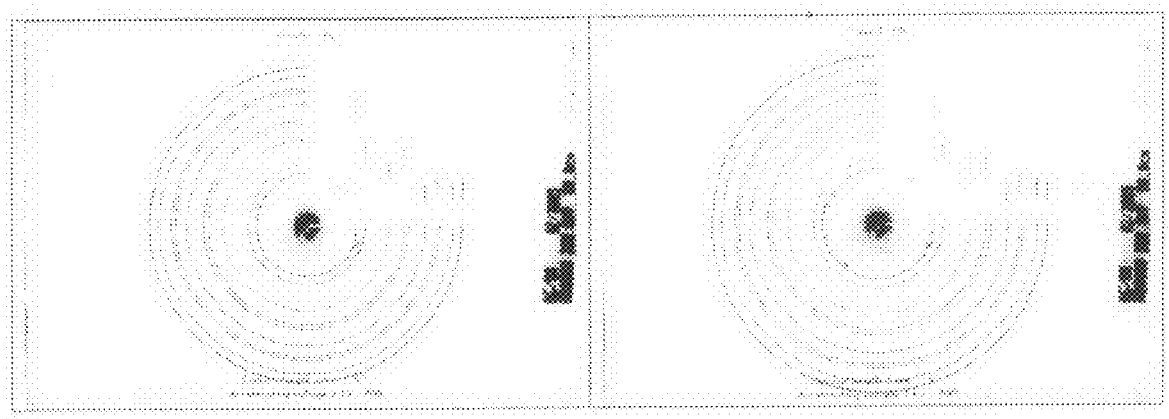

In the case of Example 10, FIG. 17, a bimetallic deposition was obtained composed of silver and rhodium nanoparticles of 5 to 20 nm in diameter, spaced at distances of about 5 to 20 nm; the density of the nanoparticles was in this case close to 410 particles/µm². The catalyst loading level was about 0.035% (or about 350 µg/g). From the diffraction pattern produced by transmission electron microscopy (17A) and also from the diagram obtained by X-ray diffraction (FIGS. 17B and 17C), the presence of two Ag and Rh metallic phases could be seen, which was a priori more favourable in terms of thermal stability of the catalysts.

In the light of the above examples, it was observed that the loading levels remained very low relative to the processes such as impregnation or else the sol-gel process and that they were of the order of 0.1 to 0.5%.

The RBS technique has furthermore made it possible to demonstrate a carbon contamination over the whole thickness of the film of the order of 1 at %, an element which was not detected in the case of films produced by impregnation or else the sol-gel process, followed by drying/calcining phases. The presence of the element carbon is mainly derived from the decomposition of the precursors and solvents.

EXAMPLE 11

In this example, the properties of the depositions from Example 6 were demonstrated by in situ and operando infrared (FTIR) characterization.

The experiment was carried out under a reaction flow of $P_{NO}$=1000 ppm, and $P_{O_2}$=10% at ambient temperature.

Figure 19A:
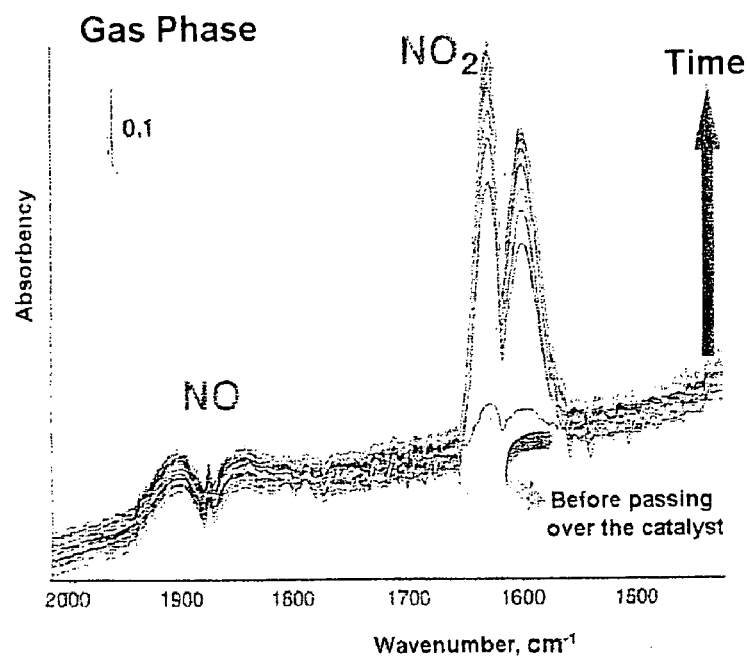
Figure 19B:
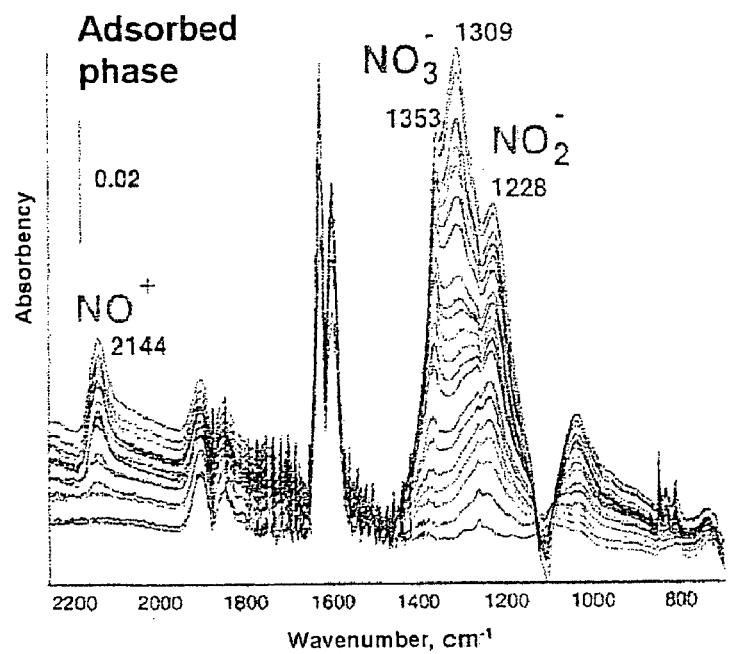

By way of indication, the first results of NO adsorption tests on a surface covered with silver nanoparticles stemming from these two experimental approaches are given in FIGS. 19A and 19B: the oxidation of NO to $NO_2$, then to nitrates, revealed the strong oxidizing ability of the silver nanoparticles, even at ambient temperature (intermediary reactive species capable of being converted to $N_2$).

REFERENCES

[1] N. Myioshi, S. Matsumoto, K. Katoh, T. Tanaka, K. Harada, N. Takahashi, K. Yokota, M. Sugiura, K. Kasahara, SAE Technical Papers Series No. 950809 (1995).

[2] M. Richter, R. Eckelt, B. Parlitz, R. Fricke, Appl. Cat. B: Environmental 151 (1998) 129.

[3] L. Olsson, E. Fridell, J. Catal. 210 (2002) 340.

The invention claimed is:

1. A process for depositing nanoparticles of silver or a silver alloy on a substrate, comprising, depositing nanoparticles of silver or a silver alloy on a substrate by chemical vapour deposition (CVD), wherein the silver or silver alloy is produced from one or more precursors comprising at least one silver precursor, and wherein the deposition is carried out in the presence of a gas comprising greater than 50 vol % of a reactive oxidizing gas.

2. The process according to claim 1, wherein the silver alloy is an alloy of silver with at least one element selected from the group consisting of at least one other metal and carbon.

3. The process according to claim 2, wherein the at least one other metal is oxidized.

4. The process according to claim 2, wherein the at least one other metal is a noble metal selected from the group consisting of platinum, palladium, rhodium and iridium.

5. The process according to claim 1, wherein the nanoparticles are enclosed in a carbon or metal oxide matrix, or are combined with a zeolite.

6. The process according to claim 1, wherein the gas comprises more than 70 vol % of the reactive oxidizing gas.

7. The process according to claim 6, wherein the gas comprises 100 vol % of the reactive oxidizing gas.

8. The process according to claim 1, wherein the reactive oxidizing gas is selected from the group consisting of oxygen, carbon dioxide, ozone, nitrous oxide $N_2O$, and mixtures thereof.

9. The process according to claim 1, wherein the gas is composed of a mixture of the oxidizing gas and an inert gas.

10. The process according to claim 9, wherein the inert gas is selected from the group consisting of argon, nitrogen, helium, and mixtures thereof.

11. The process according to claim 9, wherein the ratio of the flow rate of the oxidizing gas to the flow rate of the inert gas is greater than 1.

12. The process according to claim 1, wherein the precursors are organometallic precursors selected from the group consisting of metal carboxylates and metal β-diketonates.

13. The process according to claim 12, wherein the silver precursor is selected from the group consisting of silver carboxylates of formula $RCO_2Ag$, wherein R represents a linear or branched alkyl group having 1 to 10 carbon atoms, and silver β-diketonates.

14. The process according to claim 13, wherein the linear or branched alkyl group has 3 to 7 carbon atoms.

15. The process according to claim 13, wherein the silver β-diketonates is silver tetramethylheptanedionate.

16. The process according to claim 13, wherein the silver precursor is silver pivalate.

17. The process according to claim 1, wherein the one or more precursors are selected from the group consisting of metal nitrates.

18. The process according to claim 1, wherein the one or more precursors are used in the form of a solution in an organic solvent.

19. The process according to claim 18, wherein the one or more precursors is an organometallic.

20. The process according to claim 18, wherein the concentration of the one or more precursors in the solution is from 0.01 to 0.6 mol/l.

21. The process according claim 18, wherein the solution further comprises an amine and/or nitrile.

22. The process according to claim 20, wherein the solution comprises, in addition, an amine and/or nitrile.

23. The process according to claim 21, wherein the volume concentration of the amine and/or of the nitrile in the solution is greater than 0.1%.

24. The process according to claim 23, wherein the volume concentration of the amine and/or of the nitrile in the solution is from 0.5% to 10%.

25. The process according to claim 22, wherein the volume concentration of the amine and/or of the nitrile in the solution is greater than 0.1%.

26. The process according to claim 25, wherein the volume concentration of the amine and/or of the nitrile in the solution is from 0.5% to 10%.

27. The process according to claim 21, wherein the amine is a monoamine.

28. The process according to claim 27, wherein the monoamine is selected from the group consisting of n-hexylamine, isobutylamine, di-sec-butylamine, triethylamine, benzylamine, ethanolamine and diisopropylamine; polyamines; and mixtures thereof.

29. The process according to claim 22, wherein the amine is a monoamine.

30. The process according to claim 29, wherein the monoamine is selected from the group consisting of n-hexylamine, isobutylamine, di-sec-butylamine, triethylamine, benzylamine, ethanolamine and diisopropylamine; polyamines; and mixtures thereof.

31. The process according to claim 21 wherein the nitrile is selected from the group consisting of acetonitrile, valeronitrile, benzonitrile and propionitrile and mixtures thereof.

32. The process according to claim 22 wherein the nitrile is selected from the group consisting of acetonitrile, valeronitrile, benzonitrile and propionitrile and mixtures thereof.

33. The process according to claim 18 wherein the solvent has an evaporation temperature below the decomposition temperature of the precursor or precursors.

34. The process according to claim 33, wherein the solvent is an organic compound that is liquid at room temperature and up to 200° C. under standard pressure conditions.

35. The process according to claim 34, wherein the solvent is selected from the group consisting of mesitylene, cyclohexane, xylene, toluene, n-octane, isopropanol, tetrahydrofuran, acetylacetone, ethanol; water; and mixtures thereof.

36. The process according to claim 1, wherein the deposition is carried out at a substrate temperature less than or equal to 500° C.

37. The process according to claim 36, wherein the deposition is carried out at a substrate temperature less than or equal to 300° C.

38. The process according to claim 37, wherein the deposition is carried out at a substrate temperature from 250 to 290° C.

39. The process according to claim 1, wherein the deposition is carried out at atmospheric pressure.

40. The process according to claim 1, wherein the deposition is carried out under vacuum.

41. The process according to claim 40, wherein the deposition is carried out at a pressure of 300 Pa to 1000 Pa.

42. The process according to claim 1, wherein the deposition time is from 2 to 90 minutes.

43. The process according to claim 42, wherein the deposition time is from 5 to 30 minutes.

44. The process according to claim 1, wherein the deposition is plasma-enhanced.

45. The process according to claim 1, wherein the substrate is selected from the group consisting of porous substrates and dense substrates.

46. The process according to claim 1, wherein the substrate is made of a ceramic material.

47. The process according to claim 46, wherein the ceramic material is selected from the group consisting of alumina, ceria, and zirconia.

48. The process according to claim 1, wherein the substrate is made of silicon.

49. The process according to claim 1, wherein the substrate is made of zeolites.

50. The process according to claim 1, wherein the substrate is made of steels.

51. The process according to claim 1, wherein the substrate is made of fabrics.

* * * * *